(12) United States Patent
Grandry

(10) Patent No.: US 7,915,870 B2
(45) Date of Patent: Mar. 29, 2011

(54) METHOD OF FORMING A CURRENT SENSE CIRCUIT AND STRUCTURE THEREFOR

(75) Inventor: Hubert Grandry, Espanes (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 570 days.

(21) Appl. No.: 11/719,998

(22) PCT Filed: Sep. 9, 2005

(86) PCT No.: PCT/US2005/032327
§ 371 (c)(1),
(2), (4) Date: May 23, 2007

(87) PCT Pub. No.: WO2007/032755
PCT Pub. Date: Mar. 22, 2007

(65) Prior Publication Data
US 2007/0296483 A1    Dec. 27, 2007

(51) Int. Cl.
*G05F 1/613*    (2006.01)
(52) U.S. Cl. .................... 323/222; 323/282
(58) Field of Classification Search .................. 323/222, 323/282, 285; 315/291, 293
See application file for complete search history.

(56) References Cited

U.S. PATENT DOCUMENTS

| | | | |
|---|---|---|---|
| 5,059,889 A * | 10/1991 | Heaton | 323/285 |
| 6,140,806 A * | 10/2000 | Gohara | 323/282 |
| 6,429,641 B1 * | 8/2002 | Montrose | 324/123 C |
| 6,674,273 B2 * | 1/2004 | Oglesbee | 323/284 |
| 6,774,612 B1 * | 8/2004 | Ballenger et al. | 323/303 |
| 6,963,177 B2 * | 11/2005 | Ito et al. | 315/291 |
| 7,119,447 B2 * | 10/2006 | Larking | 257/784 |
| 7,317,302 B1 * | 1/2008 | Collins | 323/222 |
| 2004/0051382 A1 * | 3/2004 | Gavrila et al. | 307/29 |
| 2005/0231183 A1 * | 10/2005 | Li et al. | 323/299 |
| 2008/0116818 A1 * | 5/2008 | Shteynberg et al. | 315/192 |

* cited by examiner

*Primary Examiner* — Adolf Berhane
*Assistant Examiner* — Fred E Finch, III
(74) *Attorney, Agent, or Firm* — Robert F. Hightower

(57) ABSTRACT

In one embodiment, a current sense circuit is formed with a pair of series connected switches that are used to steer a load current and form a current sense signal.

23 Claims, 2 Drawing Sheets

US 7,915,870 B2

METHOD OF FORMING A CURRENT SENSE CIRCUIT AND STRUCTURE THEREFOR

BACKGROUND OF THE INVENTION

The present invention relates, in general, to electronics, and more particularly, to methods of forming semiconductor devices and structure.

Previously, the semiconductor industry utilized various methods and structures to form current sense circuits for power supply controllers. The current sense circuits generally received a load current that was regulated by the power supply controller and was applied to a load that was connected to power supply controller. The current sense circuits generally caused the load current to flow through a sense resistor and the sense resistor formed a voltage that was representative of the value of the load current. In some cases, it was desirable to use multiple sense resistors in order to select between different values of load currents. Typically, a transistor was connected in series with the sense resistor to steer the load current through the sense resistor and the transistor. One example of such a current sense circuit is disclosed in the data sheet for a step-up converter having a part number of MP1517 that was manufactured by Monolithic Power Systems, Inc., of Los Gatos, Calif. In most cases, the value of the sense voltage that was supplied to the power supply controller often varied and caused errors in the value of the load current.

Accordingly, it is desirable to have a current sense circuit that forms a current sense signal that more accurately represents the value of the load current.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
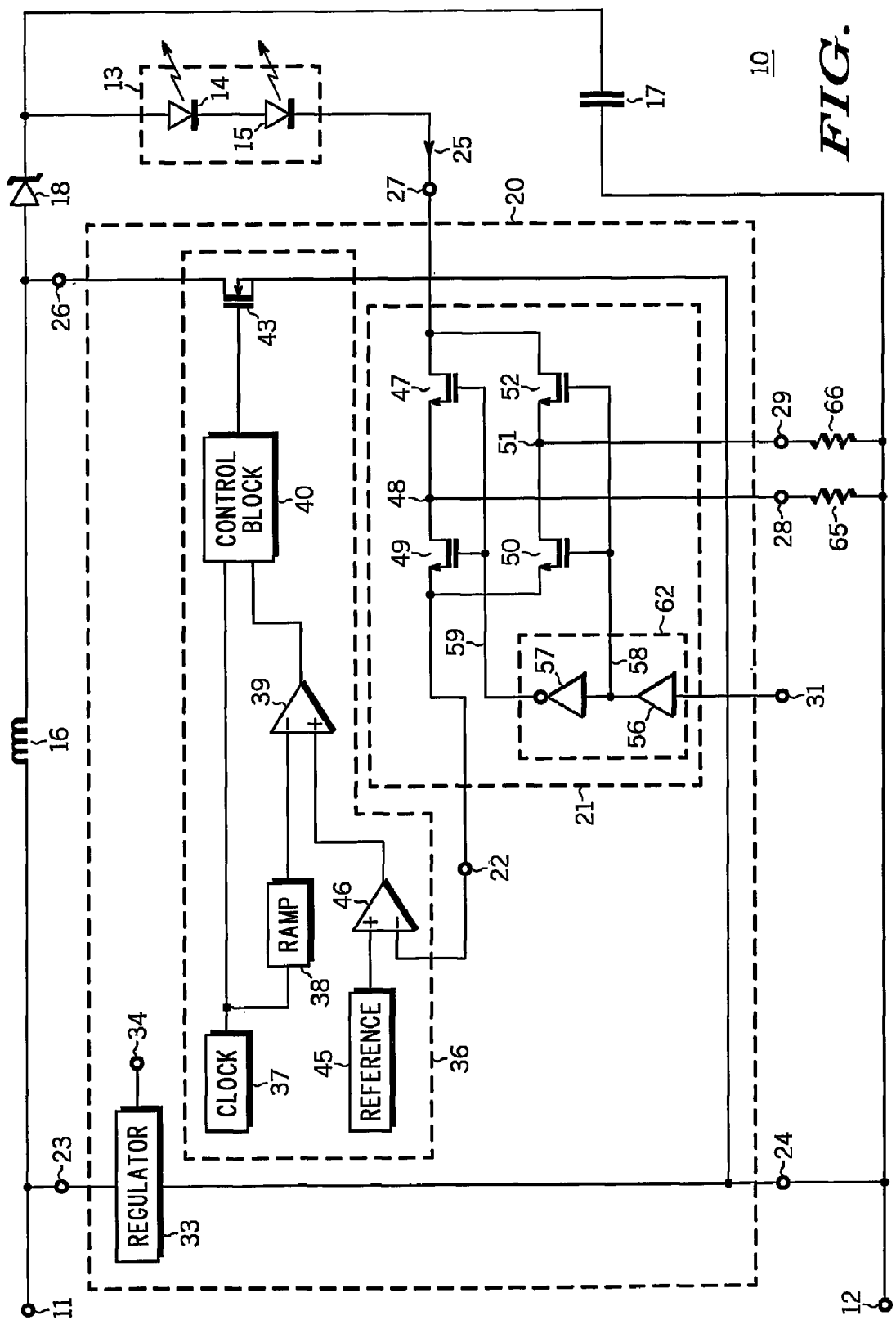
FIG. 1 schematically illustrates an embodiment of a portion of a power supply system having a current sense circuit in accordance with the present invention.

FIG. 1 schematically illustrates an embodiment of a portion of a power supply system 10. System 10 includes a power supply controller 20 that is configured to accurately regulate the value of a load current 25 that is provided to a load 13. System 10 receives power between a power input 11 and a power return 12. The voltage applied between input 11 and return 12 generally is a dc voltage from a dc source such as a battery. In most cases, an inductor 16 and a blocking diode 18 are connected externally to controller 20 to assist in providing current 25 to load 13. A capacitor 17 may also be used to assist in operating load 13. In the preferred embodiment, load 13 includes a plurality of series connected light emitting diodes (LEDs) such as an LED 14 and an LED 15. In some embodiments, diode 18 may be included within controller 20.

Controller 20 receives power between a voltage input 23 and voltage return 24 that typically are connected to input 11 and return 12, respectively. Controller 20 usually includes a switching control circuit 36, a current sense circuit 21, and an optional internal regulator or regulator 33. Regulator 33 is connected between input 23 and return 24 in order to receive the input voltage and provide an internal operating voltage on an output 34 that is used for operating the elements of controller 20 such as switching control circuit 36 and current sense circuit 21. Switching control circuit 36 generally is a PWM control circuit that forms a switching signal that is used to control a power switch, such as a transistor 43, and regulate the value of current 25. In other embodiments, circuit 36 may be other types of well-known control circuits including a pulse frequency modulator (PFM). The exemplary block diagram form of switching control circuit 36 that is illustrated in FIG. 1 includes a clock generator or clock 37, a reference generator or reference 45, an error amplifier 46, a ramp generator or ramp 38, a PWM comparator 39, a control block 40, and transistor 43. As is well known in the art, switching control circuit 36 receives a current sense signal and responsively forms the switching signal to control transistor 43 and regulate the value of current 25. Circuit 36 may also include other well know functions that are not illustrated in FIG. 1, such as over-voltage protection, under-voltage protection, thermal shut-down, peak current limit, or other well known functions.

Current sense circuit 21 includes a control circuit 62, a first current sense switch or transistor 47, a second current sense switch or transistor 52, a first coupling switch or transistor 49, and a second coupling switch or transistor 50. Control circuit 62 is configured to receive a current select control signal from a control input 31 and responsively form a first current control signal 59 and a second current control signal 58 that are used to couple either a signal from a node 48 to an output 22 of circuit 21 or a signal from a node 51 to output 22. Control circuit 62 generally includes a buffer 56, and an inverter 57. In one embodiment, current sense circuit 21 is formed on a semiconductor substrate with a switching control circuit such as circuit 36. For such an embodiment, inductor 16, capacitor 17, and diode 18 usually are external to the semiconductor substrate. In some embodiments, transistor 43 or switching control circuit 36 may also be external to the semiconductor substrate on which circuit 21 is formed.

In operation, the control signal applied to input 31 is used to select two different values for current 25. Additionally, circuit 21 is configured to form the current sense signal in a manner that results in very accurate control of the value of current 25. Switching control circuit 36 receives the current sense signal that is coupled to output 22 of circuit 21. As is well known in the art, switching control circuit 36 responsively enables or disables transistor 43 to either increase or decrease the value of load current 25. If transistor 43 is disabled, current 25 flows from inductor 16, through diode 18, through load 13 to a current input 27 of controller of circuit 36. If transistor 43 is enabled, the current from inductor 16 flows through a PWM output 26 of controller 20, through transistor 43, and to return 24. While transistor 43 is enabled, capacitor 17 supplies a current for load 13.

If transistor 43 is disabled, circuit 21 receives current 25 from input 27 on an input of circuit 21. Circuit 21 also receives the current select control signal on input 31 and selectively enables either transistors 47 and 49 or transistors 52 and 50 to form the current sense signal on output 22. Buffer 56 and inverter 57 form a selector circuit that selectively enables one of the two pairs of transistors. If the current select control signal on input 31 is low, control signal 59 on the output of inverter 57 is high, which enables transistors 47 and 49, and control signal 58 on the output of buffer 56 is low, which disables transistors 50 and 52. Enabling transistor 47 with the current select control signal selectively couples load current 25 to a first current sense element or sense resistor 65. Resistor 65 is connected to circuit 21 on a first sense input 28 of controller 20. Current 25 flows through transistor 47, to node 48, through input 28, and through resistor 65 to return 12. Steering current 25 to flow through resistor 65 forms a current sense signal on node 48. Because transistor 49 is also selectively enabled by the current control signal, transistor 49 couples the current sense signal from node 48 to output 22. Error amplifier 46 receives the current sense signal and switching control circuit 36 controls transistor 43 to regulate the value of load current 25 so that the value of the current sense signal received by amplifier 46 is substantially equal to the value of the reference signal from reference 45. Steering load current 25 through resistor 65 forms the current sense signal on node 48 independent of the value of the voltage drop across transistor 47. The value of the voltage drop across transistor 47 can vary based upon several parameters including the value of the on-resistance or Rdson of transistor 47. The value of the on-resistance can vary based upon various parameters such as temperature, the gate-to-source voltage of transistor 47, and even the value of current flowing through transistor 47. Because the current sense signal formed on node 48 and received by amplifier 46 is the value of the signal across resistor 65 which is determined by the value of current 25, the current sense signal is independent of the value of the voltage across transistor 47. Thus, even though the value of the voltage drop across transistor 47 may vary, the value of the sense voltage formed at node 48 is dependent solely upon the value of current 25 and the value of resistor 65. Since the input of amplifier 46 is a high impedance, the current flow through transistor 49 is negligible and the resulting voltage across transistor 49 is also negligible and has substantially no effect on the value of the current sense signal coupled from node 48 to output 22 by transistor 49. The value of the voltage across transistor 49 generally is no greater than about one milli-volt (1 mV). When transistors 47 and 49 are enabled and transistors 50 and 52 are disabled, circuit 36 controls the value of current 25 to a first value. Because the value of the current sense signal does not include the voltage of transistor 47, the value of the current sense signal very accurate represents the value of current 25 and is controlled by the accuracy of resistor 65. Since resistor 65 is external to circuit 21, the value of resistor 65 may be very accurate. In one example embodiment, resistor 65 was selected to be a one percent resistor and the corresponding value of current 25 was also approximately accurate to within about one percent. This is much more accurate than prior implementations that achieved accuracies no better than about five percent even the sense resistor had an accuracy of one percent. Thus the value of current 25 was maintained to a substantially constant value that varied by no more than approximately one percent.

Similarly, if the value of the control signal on input 31 is high, current control signal 59 is low which disables transistors 47 and 49 but current control signal 58 on the output of buffer 56 is high which enables transistors 52 and 50. When transistor 52 is enabled and transistor 47 is disabled, current 25 flows through transistor 52, to node 51, through a second sense input 29, through a second current sense element such as resistor 66, and to return 12. Transistor 50 couples the value of the current sense signal formed on node 51 to output 22. Transistor 52 functions similarly to transistor 47 and transistor 50 functions similarly to transistor 49. Thus, the current sense signal received by amplifier 46 is the value of the signal across resistor 66 and does not include the value of the voltage across transistor 52, and the current sense signal is independent of the value of the voltage across transistor 52. Additionally, the current flow through transistor 50 is negligible and the resulting voltage across transistor 50 has substantially no effect on the value of the sense signal coupled from node 51 to output 22 by transistor 50.

In different embodiments, more or fewer transistor pairs and sense resistors, such as resistor 65 and transistors 47 and 49, and a different configuration of control circuit 62 may be used to provide additional selectable values for current 25. For example, in another embodiment it may be possible to enable all of transistors 47, 49, 50, and 52 simultaneously as well as in pairs to form a third state for current 25.

In order to facilitate this operation for circuit 21, a drain of transistor 47 is commonly connected to a drain of transistor 52 and to input 27. A source of transistor 47 is commonly connected to a drain of transistor 49, node 48, and input 28. A source of transistor 49 is commonly connected to output 22, and a source of transistor 50. A gate of transistor 49 is commonly connected to a gate of transistor 47, and the output of inverter 57. A drain of transistor 50 is commonly connected to node 51, input 29, and a source of transistor 52. A gate of transistor 52 is commonly connected to a gate of transistor 50, the output of buffer 56, and the input of inverter 57. An input of buffer 56 is connected to input 31.

Figure 2:
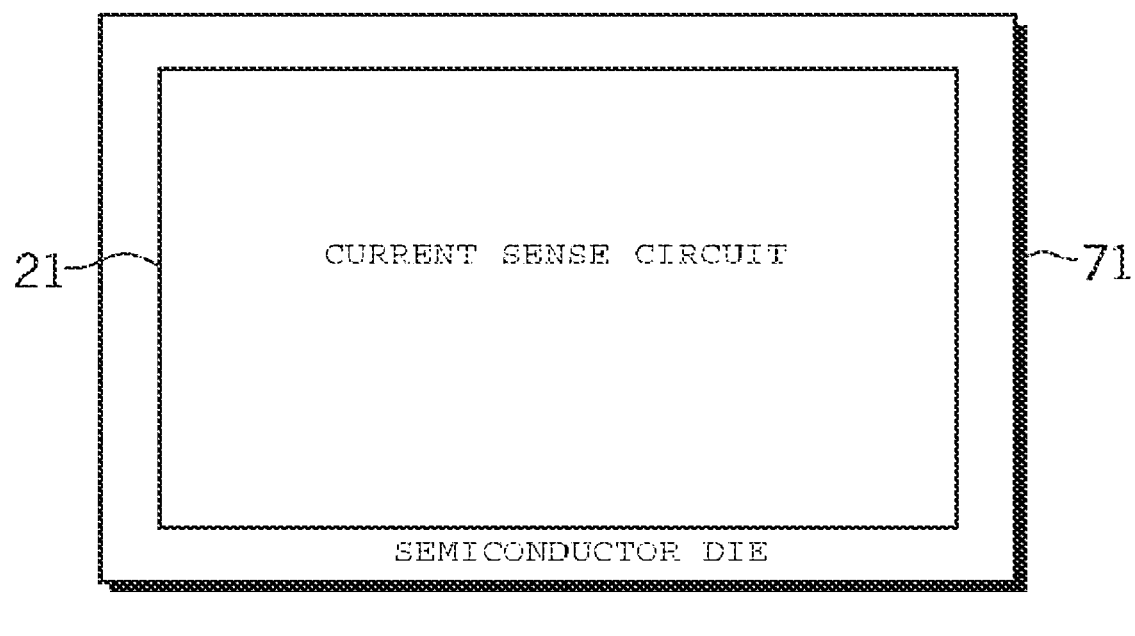
FIG. 2 schematically illustrates an enlarged plan view of a semiconductor device that includes a portion of the power system of FIG. 1 in accordance with the present invention.

FIG. 2 schematically illustrates an enlarged plan view of a portion of an embodiment of a semiconductor device 70 that is formed on a semiconductor die 71. Circuit 21 is formed on die 71. Die 71 may also include other circuits, such as circuit 36, that are not shown in FIG. 2 for simplicity of the drawing. Circuit 21 and device 70 are formed on die 71 by semiconductor manufacturing techniques that are well known to those skilled in the art.

In view of all of the above, it is evident that a novel device and method is disclosed. Included, among other features, is coupling a pair of transistors in series in a feedback path of a switching controller to accurately regulate a load current to a substantially constant value. Connecting a sense element to the common connection of the transistors facilitates steering the load current through the sense element and forming a voltage across the sense element that is independent of the voltage across one of the transistors.

While the subject matter of the invention is described with specific preferred embodiments, it is evident that many alternatives and variations will be apparent to those skilled in the semiconductor arts. Circuit 21 may also be used to provide a true cut-off function for controllers similar to controller 20. More specifically the subject matter of the invention has been described for N-channel MOS transistors although the method is directly applicable to other bipolar transistors, as well as to other MOS transistors as well as to BiCMOS transistors, metal semiconductor FETs (MESFETs), HFETS, bipolar and other types of transistors. Additionally, the word "connected" is used throughout for clarity of the description, however, it is intended to have the same meaning as the word "coupled". Accordingly, "connected" should be interpreted as including either a direct connection or an indirect connection.

The invention claimed is:
1. A current sense circuit comprising:
an input configured to receive a load current that flows through a load and from the load into the input wherein the load current is used to operate the load;

a first switch configured to route the load current to flow from the input through the first switch and through a first sense element; and a second switch configured to selectively couple the first sense element to a control circuit that is configured to regulate a value of the load current wherein current that flows through the sense element does not flow through the second switch.

2. The current sense circuit of claim 1 wherein the first switch is configured to selectively couple the load current to the first sense element and form a first sense signal.

3. The current sense circuit of claim 1 wherein the second switch is configured to selectively couple a voltage across the first sense element to the control circuit.

4. The current sense circuit of claim 1 wherein the first switch is configured to selectively route the load current to the first sense element.

5. The current sense circuit of claim 4 further including a third switch configured to route the load current to flow from the input through the third switch and through a second sense element; and a fourth switch configured to selectively couple the second sense element to the control circuit wherein the load current does not flow through the fourth switch.

6. The current sense circuit of claim 5 further including a selector circuit to selectively enable the first and second switches or the third and fourth switches.

7. The current sense circuit of claim 1 wherein the first switch is a first transistor having a first current carrying electrode coupled to conduct the load current, a second current carrying electrode coupled to the first sense element to conductor the load current, and a control electrode, and wherein the second switch is a second transistor having a first current carrying electrode coupled to the first sense element, a second current carrying electrode, and a control electrode.

8. The current sense circuit of claim 1 wherein the first switch and the second switch are integrated onto a single semiconductor substrate along with at least a portion of the control circuit.

9. The current sense circuit of claim 1 wherein the first sense element is a resistor coupled to receive the load current and form a sense voltage.

10. The current sense circuit of claim 9 wherein the control circuit is one of a PWM or PFM controller having an error amplifier and the second switch is configured to couple the sense voltage to the error amplifier.

11. The current sense circuit of claim 1 further including a third switch operatively coupled for being switched to conduct a current through an inductor and form the load current for the load wherein the switching regulates the value of the load current responsively to the current sense signal.

12. The current sense circuit of claim 11 wherein the current through the third switch is different from the load current.

13. A method of forming a current sense circuit comprising:

configuring the current sense circuit to conduct a load current that is to flow through a load and be used to operate the load; and configuring the current sense circuit to use a first switch to steer the load current to flow from the load through the first switch and through a first sense element and responsively form a first current sense signal that is representative of a value of the load current wherein a value of the first current sense signal is independent of a value of a voltage dropped across the first switch.

14. The method of claim 13 further including configuring a second switch to couple the first current sense signal to a control circuit configured to regulate a value of the load current responsively to a value of the first current sense signal wherein current that flows through the sense element does not flow through the second switch.

15. The method of claim 13 further including configuring a second switch of the current sense circuit to steer the load current to flow from the load through a second sense element and responsively form a second current sense signal that is representative of a value of the load current wherein a value of the second current sense signal is independent of a value of a voltage dropped across the second switch.

16. The method of claim 15 further including configuring a third switch to couple the second current sense signal to a control circuit and configuring the control circuit to regulate the value of the load current responsively to the value of the second current sense signal.

17. The method of claim 15 wherein configuring the current sense circuit to conduct the load current includes configuring the current sense circuit to selectively steer the load current to flow through the first sense element and to selectively steer the load current to flow through the second sense element.

18. The method of claim 13 further including configuring the current sense circuit to form a drive signal to switch a third switch to conduct a current through an inductor and form the load current for the load wherein the switching regulates the value of the load current.

19. A method of forming a current sense circuit comprising:

configuring a current regulation circuit to regulate a load current that flows through a load responsively to a current sense signal;

configuring a first switch in series with a second switch with a first common node connection between the first switch and the second switch; and coupling the first switch and second switch in series in a feedback path of the current regulation circuit to couple the current sense signal to the current regulation circuit wherein the first switch conducts the load current to flow from the load to the common node and through the common node and wherein the second switch does not conductor the load current.

20. The method of claim 19 further including configuring the common node to couple the load current to flow through a first current sense element and responsively form the current sense signal.

21. The method of claim 19 wherein coupling the first switch and second switch in series includes configuring the first switch to steer the current to flow through a current sense element at the first common node and responsively form the current sense signal.

22. The method of claim 19 wherein coupling the series connected first switch and second switch in series in the feedback path includes coupling the second switch to selectively couple the current sense signal to the current regulation circuit wherein the load current flows from the common node to a return node and not though the second switch.

23. The method of claim 22 further including coupling a series connected third switch and fourth switch in series in the feedback path wherein the series connected third switch and fourth switch are in parallel with the series connected first switch and second switch.

* * * * *